United States Patent [19]

Küpfer

[11] 4,118,133

[45] Oct. 3, 1978

[54] DEVICE FOR LOCKING ELECTRICAL UNITS

[75] Inventor: Theo Küpfer, Lupfig, Switzerland

[73] Assignee: BBC Brown, Boveri & Company Limited, Baden, Switzerland

[21] Appl. No.: 779,789

[22] Filed: Mar. 21, 1977

[30] Foreign Application Priority Data

Apr. 28, 1976 [CH] Switzerland .................. 5315/76

[51] Int. Cl.$^2$ ............................................... F16B 3/06
[52] U.S. Cl. ..................... 403/24; 403/386; 403/323; 339/75 R; 211/94
[58] Field of Search .............. 211/94; 361/338, 339; 339/75 R, 75 M; 312/333; 403/386, 384, 389, 323, 322, 325, 24

[56] References Cited

U.S. PATENT DOCUMENTS

| | | | |
|---|---|---|---|
| 2,855,454 | 10/1958 | Alden | 339/75 M |
| 3,199,938 | 8/1965 | Vouk | 312/333 |
| 3,299,324 | 1/1967 | Yarbrough | 361/338 |
| 3,977,749 | 8/1976 | Langenbach | 339/75 M |

*Primary Examiner*—Andrew V. Kundrat
*Attorney, Agent, or Firm*—Werner W. Kleeman

[57] ABSTRACT

A locking device arranged on an electrical unit slidably received in a receptacle of a rack, to retain the unit in the rack, said locking device comprising two stop members spaced apart in the direction of insertion of the electrical unit and displaceable relative to one another by means of a manually actuatable drive. The rearmost one of said stop members, considered in the direction of removal of the electrical unit from the rack, being adjustable by means of an adjusting member between an insertion position within the free cross-section of the rack receptacle and a locking position in which a portion thereof extends beyond the free cross-section of the receptacle to engage a rack member of the rack.

11 Claims, 2 Drawing Figures

DEVICE FOR LOCKING ELECTRICAL UNITS

BACKGROUND OF THE INVENTION

The present invention relates to a new and improved construction of a locking device for the locking of electrical units, particularly electronic units, which include at least one unit frame and are constructed so as to be slidably inserted into a mounting rack.

Such units, in practice, also called "parts" are generally collected together in large numbers in multi-stage racks, there being provided within the individual stages mutually adjacent receptacles into each of which a unit may be slid. The rack stages are usually formed by horizontally extending rack rails arranged at the front of the rack.

A heretofore usual manner of locking a unit, which itself generally consists of a front panel with frames - the unit frames - fastened behind it, has been by means of a fastening element engaging the unit, usually laterally or at its end, or by means of connecting elements that, on the one hand, engage the front panel of the unit and, on the other hand, engage the rack, e.g. on a rack rail.

In the first-mentioned kind of locking means not only is the accessibility of the locking device limited but also space for the insertion of elements, such as printed circuit boards and the like, into the unit is lacking. The second kind of locking means makes it necessary for the front panel to have a relatively great strength, which is undesirable for this member because of the increasing use of cheap plastics materials.

SUMMARY OF THE INVENTION

An important object of the present invention is, therefore, to provide a locking device for electrical units which can be built so as to act directly between the unit frame and the rack, but which however is characterized by small spatial requirements and simplicity.

Still a further significant object of the present invention aims at the provision of a new and improved construction of locking device for electrical units which is relatively simple in construction and design, economical to manufacture, easy to use, and provides for simple locking and unlocking of the related electrical unit.

Yet a further noteworthy object of the present invention aims at the provision of a locking device for electrical units allowing for positive and relatively easy insertion of such unit into a rack and selective locking and unlocking of the thus inserted electrical unit at the rack, without the need for undertaking complicated manipulations, while ensuring for both positive locking action as well as easy unlocking action whenever a given electrical unit is to be removed from its associated receptacle.

According to the present invention there is provided a locking device arranged on an electrical unit slidably receiving in a receptacle of a rack, to retain the unit in the rack, said locking device comprising two stop members spaced apart in the direction of insertion of the unit and displaceable relative to one another by means of a manually actuatable drive. The rearmost one of said stop members, considered in the direction of removal of the unit from the rack, being adjustable by means of an adjusting member between an insertion position within the free cross-section of the rack receptacle and a locking position in which a portion thereof extends beyond the free cross-section of the receptacle to engage for instance a rack member.

An electrical unit provided with such a locking device may slide freely into the rack receptacle with the rear stop situated in the insertion position, in fact until shortly before reaching the position where a strip connector or other electrical connecting device of the unit engages the corresponding connecting device of the rack. The rear stop is then conveyed by a simple displacement into its locking position in which, because of its projection above the free cross-section of the unit receptacle, it necessarily engages behind a rack member, e.g. the stage rail. Afterwards the distance between the stops is reduced by appropriate actuation of the drive, so that the rear stop or stop member abuts against the stage rail or other rack member and forces the unit into its fully-in or fully inserted position. The electrical connecting or coupling means are thus also brought into operative mutual engagement, which, instead of pushing in by hand without assistance from gearing, represents a considerable assistance in servicing or installation.

According to an advantageous embodiment of the invention there is provided, for the displacement of the rear stop member with respect to the front stop member, a screw of spindle drive, that also advantageously serves as an adjusting member for the displcement of the rear stop member between its insertion position and its locking position. A particularly simple constuction and mode of operation thus results.

It is also advantageous for the rear stop member to be movable substantially parallel to the direction of insertion, as well as being pivotally mounted in a plane lying substantially perpendicular to the direction of insertion. A screw-threaded spindle, on which the rear stop member is longitudinally displaceable and pivotally mounted is particularly suitable as the screw drive. The mounting for the two movements is thus provided in the simplest manner with only one element. The pivotal movement is advantageously carried out from the screw drive by means of a slipping clutch or an otherwise yielding actuated coupling or entrainment means, so that only a single actuating movement is necessary.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
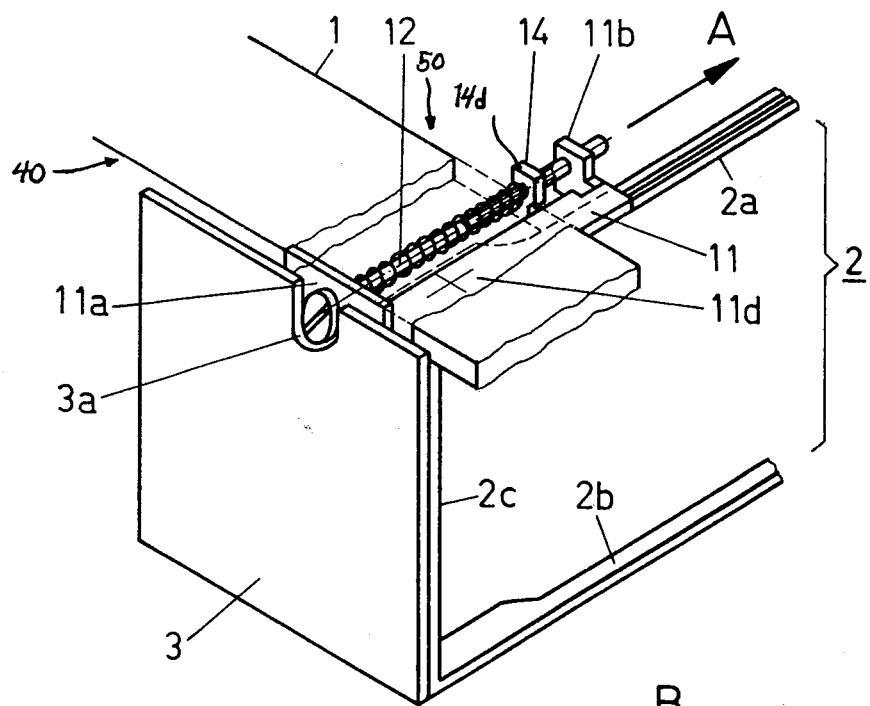
FIG. 1 shows a general perspective view of a locking device, with cut-away portions of an electrical unit and a rack rail.

Describing now the drawings, only a part of a rack rail 1, of a rack indicated generally by reference character 40 and containing a number of receptacles, only one of which has been generally indicated by reference character 50, and which rack is not otherwise shown to simplify the illustration of the drawings, is represented in FIG. 1. Beneath the rack rail 1 there is situated in its related receptacle 50 a unit having a unit frame 2 and a front panel 3 and shown in the fully inserted position. The unit frame 2 consists of upper and lower members 2a, 2b and a front member 2c joined to the front panel 3. A similar frame (not shown) may be affixed to the other side of and behind the front panel 3. To the forward end portion of the upper frame member 2a there is secured a lock base or carrier 11 forming the base member of the locking device, in point of fact by a screw or other suitable fastener 11d represented only by crossed lines. The direction in which the unit is slidingly inserted into the rack 40 is represented by arrow A. In the illustrated position of the locking device two stops or stop members 11a and 14, which are further discussed below, engage in front of and behind the rack rail 1 and provide a rigid clamp connection.

Figure 2:
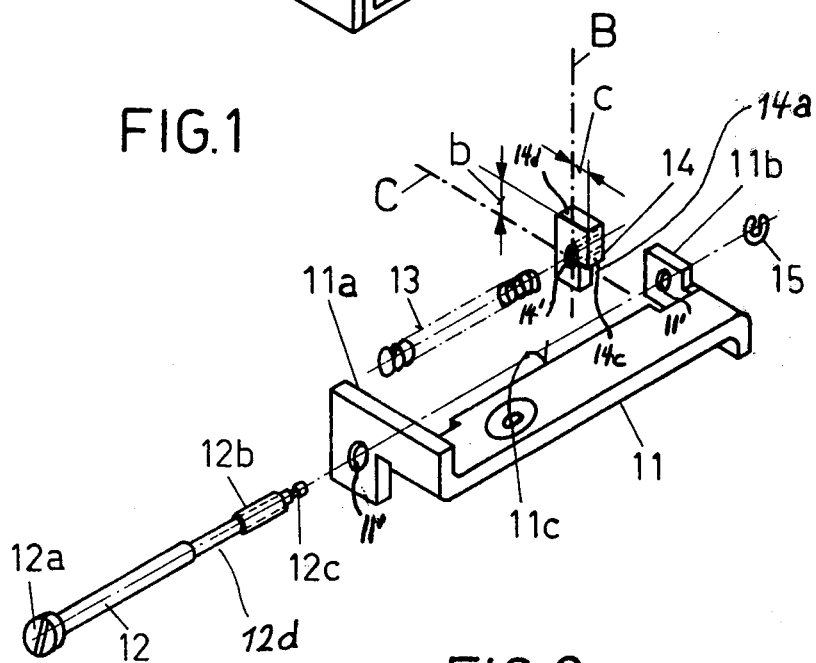
FIG. 2 shows an exploded perspective view of the locking device of FIG. 1.

The construction of the clamping device is explained in detail with further reference to FIG. 2. The locking device base 11 is provided at its front and rear ends respectively, as shown, with two short, upwardly projecting stirrup portions or lugs 11a, 11b, the forward lug 11a forming the already mentioned front stop of the locking device. In aligned bores or holes 11' of the stirrup members or lugs 11a and 11b there is mounted, parallel to the direction of insertion, for rotation, a manually actuatable drive incorporating, by way of example, a threaded spindle 12 having at one end a slotted head 12a by which it may be actuated, a screw-threaded intermediate portion 12b and a circumferential groove 12c at its other end, in which a split ring 15 or equivalent structure engages to secure the spindle 12 in position, so that while it rotates freely it is secured against axial movement.

As best seen by referring to FIG. 1, on the threaded spindle or screw 12, in the region between the stirrup members or lugs 11a, 11b in which it is mounted, there is placed a yielding rotary drive providing a slipping clutch means or entrainment member, here shown by way of example as a helical spring 13 and the stop member 14 having a screw-threaded hole 14' working on the screw-threaded rod portion 12b so that the stop member 14 acts as a nut. The pressure of the spring 14 is received at one end by the stirrup member or lug 11a and at the other end by the stop member or stop nut 14. The axial resilient bias thus applied to the stop nut 14 gives rise to a frictional force between the stop nut 14 and the threaded spindle 12 which causes the stop nut 14 to rotate with the spindle so far as it is free to perform this pivotal movement. In this embodiment the pivotal movement is limited, by the cooperation of a notch 14a formed in the edge 14c of the stop nut 14 with one of the longitudinal edges 11c of the lock base 11, to about 90° between the angular positions indicated by the chain lines B and C.

As is shown in FIG. 2, the stop nut 14 has, in two directions, mutually displaced by 90°, two different dimensions b and c from its periphery to the axis of the screw thread, dimension b being substantially larger than dimension c. In the pivotal position shown the outer edge 14d of the stop nut 14 corresponding to the dimension b, projects above the free cross-section of the rack receptacle and the electrical unit so far that this stop nut 14 engages against the rack rail 1 as seen in FIG. 1. Upon turning the threaded spindle 12 in the counter-clockwise direction the stop nut 14 is, as explained, transported from the position B into the position C as soon as, after initial clamping and rotational locking at the rack rail 1, it is moved rearwardly and thus freed from such rack rail. In position C the outer edge of the stop nut 14 lies within the free cross-section of the unit receptacle 50 because of its smaller dimension c, that is, below the bottom of the rack rail 1. In this position of the rear stop nut 14 the unit may thus be withdrawn from the rack 40 in the direction opposite to that indicated by the arrow A, and conversely, likewise inserted in this direction A back into the rack. Subsequent clockwise rotation of the threaded spindle 12 leads, owing to the frictional coupling, to pivotal movement of the stop nut 14 into position B and then to its displacement in the forward direction to abut against the back of the rack rail 1. This rotary motion of the threaded spindle 12, which in the embodiment shown forms the screw drive and also the adjusting member for displacement of the stop nut 14 between its two pivotal positions, is in the simplest manner effected by the slotted head 12a accessible through a notch 3a in the front panel 3.

If the unit is not pushed sufficiently far into the rack, or if the stop nut is not shifted sufficiently far back on the spindle, the stop nut cannot move into the pivotal position B, but strikes against the underside of the rack rail 1. In order now to avoid excessive compression of the spring 13 by accidental over-rotation of the spindle 12 in the clockwise direction, the spindle is preferably provided with an unthreaded neck portion 12d, on to which the stop nut 14 then runs and ends its axial movement. Thus also a false assumption that a unit is locked in place when in fact the rear stop nut 14 has not engaged, is prevented, since the spindle may be turned endlessly.

While there are shown and described present preferred embodiments of the invention, it is to be distinctly understood that the invention is not limited thereto, but may be otherwise variously embodied and practiced within the scope of the following claims.
ACCORDINGLY,

What I claim is:

1. A locking device arranged on an electrical unit slidably received in a predetermined direction of insertion in a receptacle of a rack incorporating at least one rack member, to retain the electrical unit in the rack, said locking device comprising:
   two stop members spaced apart in the direction of insertion of the electrical unit;
   said two stop members defining front and rear spaced stop members straddling the rack member when locking the electrical unit in the receptacle of the rack;
   manually actuatable drive means cooperating with said two stop members for displacing said two stop members relative to one another;
   an adjusting member for adjusting said rear stop member between an insertion position within the free cross-section of the rack receptacle and a locking position in which a portion thereof extends beyond the free cross-section of the receptacle to engage the rack member of the rack.

2. A locking device arranged on an electrical unit slidably received in a predetermined direction of insertion in a receptacle of a rack incorporating at least one rack member, to retain the electrical unit in the rack, said locking device comprising:
   two stop members spaced apart in the direction of insertion of the electrical unit;
   said two stop members defining front and rear stop members;
   manually actuatable drive means cooperating with said two stop members for displacing said two stop members relative to one another;
   an adjusting member for adjusting said rear stop member between an insertion position within the free cross-section of the rack receptacle and a locking position in which a portion thereof extends beyond the free cross-section of the receptacle to engage the rack member of the rack; and said manually actuatable drive means comprises a screw drive for moving said rear stop member with respect to said front stop member.

3. The locking device as defined in claim 2, wherein:

said screw drive mounts said rear stop member for pivotal movement between said insertion position and said locking position; and said screw drive is structured to also operate as said adjusting member for altering the pivotal position of said rear stop member.

4. The locking device as defined in claim 3, wherein:

said screw drive coacts with said rear stop member for adjustment thereof in a direction substantially parallel to the direction of insertion of said electrical unit in said rack receptacle; and said screw drive mounting said rear stop member for pivotable movement in a plane substantially perpendicular to said substantially parallel direction.

5. The locking device as defined in claim 3, wherein:

said screw drive comprises a threaded spindle having a lengthwise axis and extending substantially parallel to said direction of insertion; and said rear stop member being mounted on said threaded spindle for axial movement therealong and for pivotable movement about the lengthwise axis of said threaded spindle.

6. The locking device as defined in claim 3, further including:

a yielding rotary drive provided between the rear stop member and the screw drive.

7. The locking device as defined in claim 6, wherein:

said yielding rotary drive includes slipping clutch means.

8. The locking device as defined in claim 7, wherein:

said slipping clutch means include an entrainment member.

9. The locking device as defined in claim 8, wherein:

said entrainment member comprises a helical spring surrounding the screw drive and abutting against said rear stop member.

10. The locking device as defined in claim 5, further including:

a lock base member provided with stirrup members spaced apart in the direction in which the electrical unit is inserted into its rack receptacle;

one of said stirrup members acting as said front stop member;

said two stirrup members having said threaded spindle mounted for rotation therein;

means for securing the threaded spindle against axial movement with respect to said two stirrup members; and said rear stop member comprises a stop nut pivotably mounted on said threaded spindle.

11. The locking device as defined in claim 10, wherein:

said stop nut is pivotably mounted on said threaded spindle for movement between two pivotable positions;

said stop nut being structured such that in one of its pivotable positions defining said locking position it engages said lock base member, whereby further rotation of said stop nut is prevented.

* * * * *